(12) United States Patent
Ho et al.

(10) Patent No.: US 7,307,849 B2
(45) Date of Patent: Dec. 11, 2007

(54) FLASH MEMORY DISK

(75) Inventors: Lin-Ray Ho, Taipei (TW); Yu-Chang Lin, Taipei (TW)

(73) Assignee: Silicon Power Computer & Communications Inc., Taipei (TW)

( * ) Notice: Subject to any disclaimer, the term of this patent is extended or adjusted under 35 U.S.C. 154(b) by 8 days.

(21) Appl. No.: 11/438,429

(22) Filed: May 23, 2006

(65) Prior Publication Data

US 2007/0127219 A1 Jun. 7, 2007

(30) Foreign Application Priority Data

Dec. 7, 2005 (TW) .............................. 94221299 U

(51) Int. Cl.
*H05K 7/12* (2006.01)

(52) U.S. Cl. ...................... 361/737; 361/752; 361/754; 361/759; 361/801; 439/131

(58) Field of Classification Search ................ 361/732, 361/736, 737, 740, 747, 752, 754, 759, 798, 361/801; 439/131, 135, 136, 140, 144, 147
See application file for complete search history.

(56) References Cited

U.S. PATENT DOCUMENTS

| | | | | |
|---|---|---|---|---|
| 5,920,459 | A * | 7/1999 | Weber et al. ................ 361/752 |
| 6,456,500 | B1 * | 9/2002 | Chen ........................... 361/752 |
| 6,567,273 | B1 * | 5/2003 | Liu et al. ..................... 361/737 |
| 6,676,419 | B1 * | 1/2004 | Lin et al. .................... 439/76.1 |
| D494,969 | S * | 8/2004 | Lin ............................. D14/356 |
| 6,808,400 | B2 * | 10/2004 | Tu .............................. 439/131 |
| 6,979,210 | B2 * | 12/2005 | Regen et al. ................ 439/131 |
| 6,999,322 | B1 * | 2/2006 | Lin ............................. 361/752 |
| 7,004,780 | B1 * | 2/2006 | Wang ......................... 439/353 |
| 7,009,847 | B1 * | 3/2006 | Wu et al. .................... 361/737 |
| 7,035,110 | B1 * | 4/2006 | Wang et al. ................. 361/737 |
| 7,090,515 | B2 * | 8/2006 | Regen et al. ................ 439/131 |
| 7,097,472 | B2 * | 8/2006 | Parker ........................ 439/131 |
| 7,104,814 | B1 * | 9/2006 | She et al. ................... 439/131 |
| D541,796 | S * | 5/2007 | Chen ......................... D14/356 |
| D541,797 | S * | 5/2007 | Chen ......................... D14/356 |

* cited by examiner

*Primary Examiner*—Dean A. Reichard
*Assistant Examiner*—Dameon E. Levi
(74) *Attorney, Agent, or Firm*—Rosenberg, Klein & Lee

(57) ABSTRACT

The frame of a flash memory disk has an opening, a resilient support and a pair of switches. The pair of switches is extended from the frame and is constricted at their connection portions. Two recesses are formed at inner surfaces of the pair of switches. A PCB includes a flash memory and a USB connector thereon. A carrier has a pair of resilient wing latches and a resilient end latch. The carrier accommodates the PCB and exposes the USB connector. The carrier slides within the frame to extend or to retract the USB connector through the opening. A spring is secured between the carrier and the frame. An upper housing is assembled upon the frame, wherein the upper housing includes a button contacting the resilient support. A lower housing is assembled to the frame.

3 Claims, 6 Drawing Sheets

FLASH MEMORY DISK

RELATED APPLICATIONS

The present application is based on, and claims priority from, Taiwan Application Serial Number 94221299, filed Dec. 7, 2005, the disclosure of which is hereby incorporated by reference herein in its entirety.

BACKGROUND

1. Field of Invention

The present invention relates to a computer-readable storage apparatus. More particularly, the present invention relates to a universal serial bus (hereafter USB) computer-readable flash memory disk.

2. Description of Related Art

As flash memory manufacturing methods advance, flash memories of larger and larger capacities are being installed into various types of electronic devices. Some large-capacity flash memory disks are already available that are smaller than a fingertip.

The commonest interface of portable flash memory disks is the universal serial bus (USB). The USB connector of most flash memory disks is usually housed and protected from dust by a detachable cap.

However, when a portable flash memory disk is inserted into a computer, its detached cap may be left unnoticed near the computer and lost due to its small size. Once the extra cap is lost, the USB connector cannot be easily shielded from dust.

SUMMARY

It is therefore the objective of the present invention to provide a flash memory disk whose USB connector can be automatically extended and manually retracted.

In accordance with the foregoing and other objectives of the present invention, a flash memory disk is provided. The frame of the flash memory disk has an opening, a resilient support and a pair of switches. The pair of switches is extended from the frame. A pair of recesses is formed at inner surfaces of the pair of switches. A printed circuit board includes a flash memory and a USB connector thereon. A carrier has a pair of resilient wing latches and a resilient end latch. The carrier accommodates the printed circuit board and exposes the USB connector. The carrier slides within the frame so as to extend or retract the USB connector through the opening. When the USB connector extends from the frame, each of the pair of resilient wing latches moves outwards to engage into each of the pair of recesses at inner surfaces of the pair of withdrawn switches. When the USB connector is retracted into the frame, the resilient end latch engages into a recess of the resilient support. A spring is secured between the carrier and the frame so as to provide a force for extending the USB connector. An upper housing is assembled upon the frame, wherein the upper housing includes a button contacting the resilient support. When the button is pressed, the resilient end latch is removed from the recess of the pressed resilient support. A lower housing is assembled to the frame.

Thus, the flash memory disk not only provides a function of storing its USB connector, but also extends its USB connector by merely pushing a button.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings, FIGS. 1A and 1B respectively illustrate a top and a side view of a flash memory disk, of which a USB connector extends out of a housing, according to one preferred embodiment of this invention.

DESCRIPTION OF THE PREFERRED EMBODIMENTS

Figure 1A:
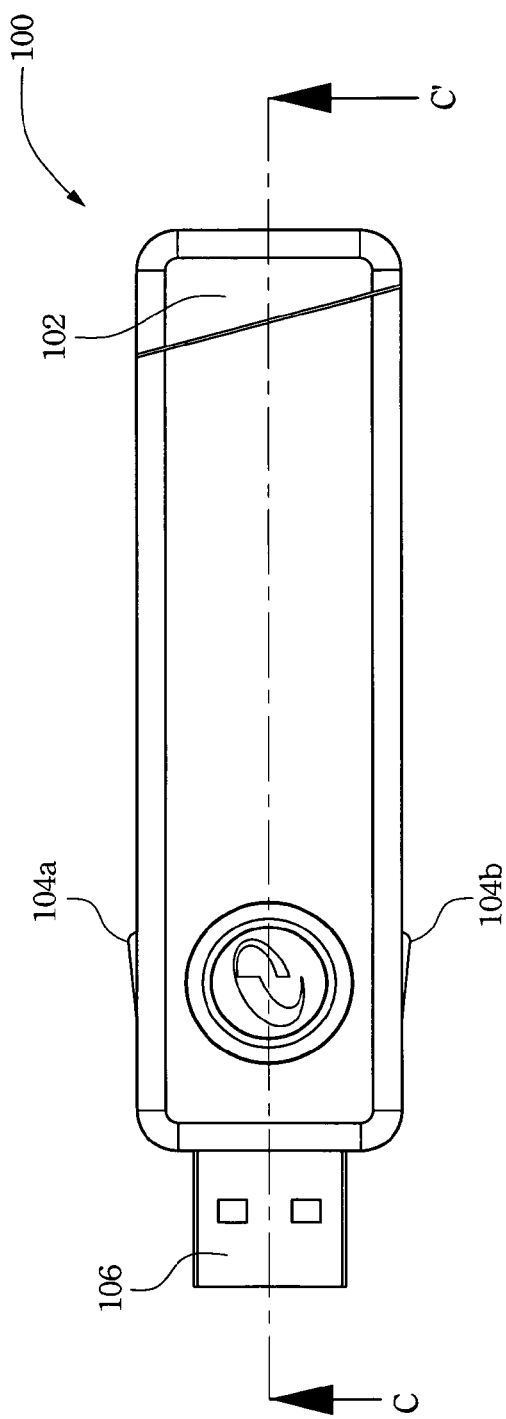

Reference will now be made in detail to the present preferred embodiments of the invention, examples of which are illustrated in the accompanying drawings. Wherever possible, the same reference numbers are used in the drawings and the description to refer to the same or like parts.

The present invention is provided to equip a flash memory disk with a function of storing its idle USB connector. For user convenience, the flash memory disk has a function of extending and retracting its USB connector.

Figure 1B:
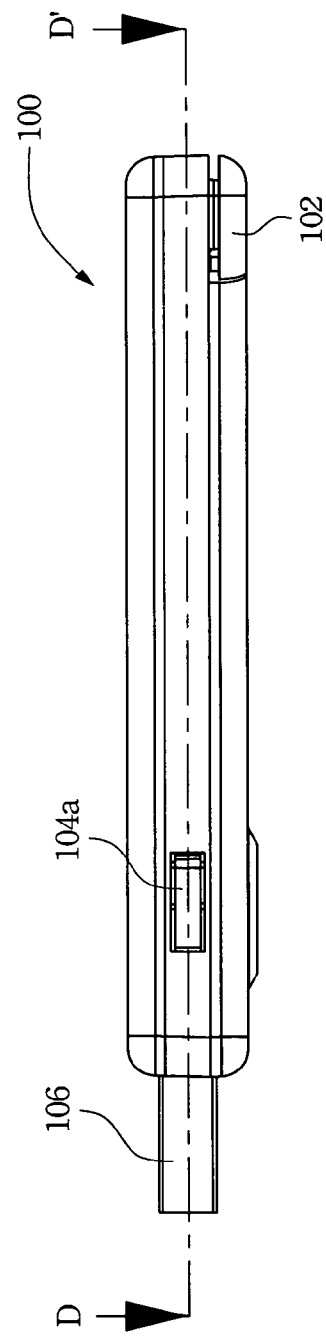

FIGS. 1A and 1B respectively illustrate a top and a side view of a flash memory disk, of which a USB connector extends out of a housing, according to one preferred embodiment of this invention. A USB connector 106 extends from a housing of a flash memory disk 100 in both FIGS. 1A and 1B. The USB connector 106 is inserted into a corresponding receptacle of a computer so as to communicate data. When a pair of switches 104a/104b of the flash memory disk 100 is pressed by a user, the USB connector 106 can be retracted.

Figure 2:
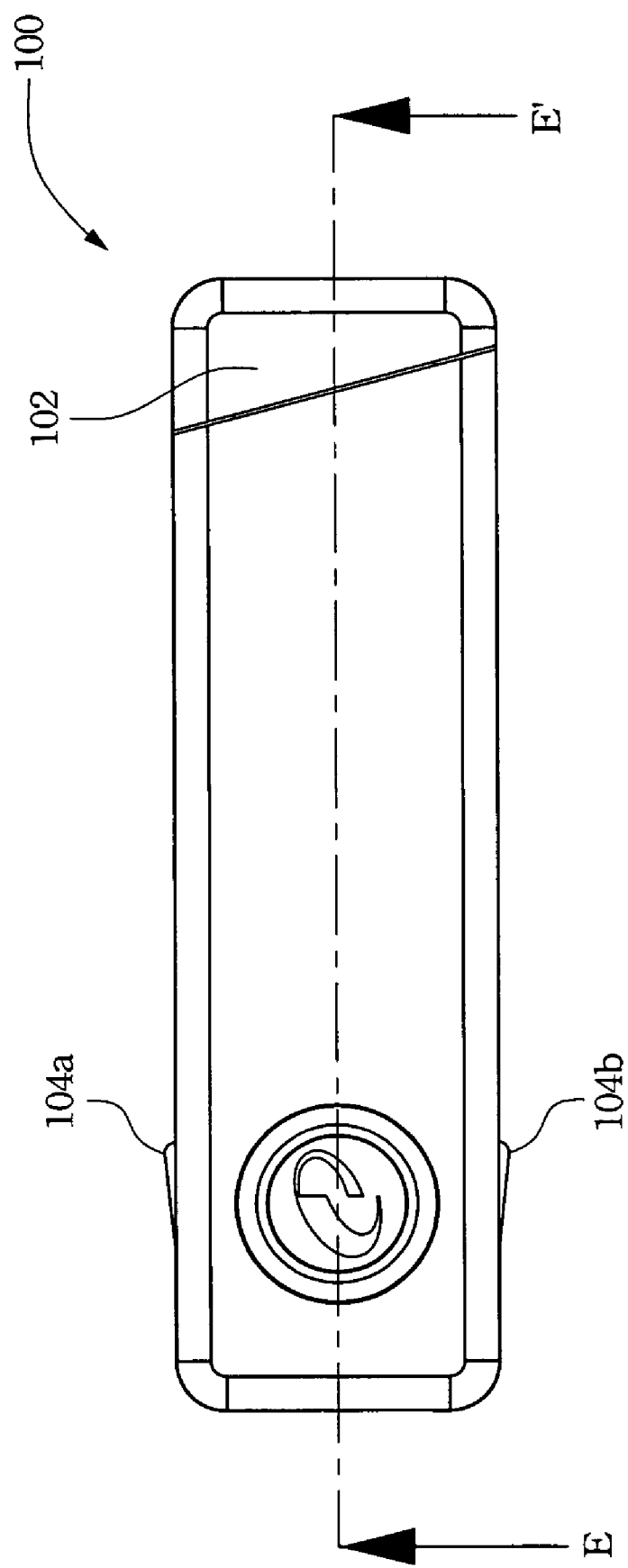
FIG. 2 illustrates a top view of a flash memory disk, of which a USB connector is hidden within a housing, according to one preferred embodiment of this invention.

FIG. 2 illustrates a top view of a flash memory disk, of which a USB connector is hidden within a housing, according to one preferred embodiment of this invention. When the retractable USB connector 106 is pushed into the housing of the flash memory disk 100, it is illustrated as FIG. 2. When a button 102 is pressed, the USB connector 106 extends from the housing as illustrated in FIGS. 1A and 1B.

Figure 3:
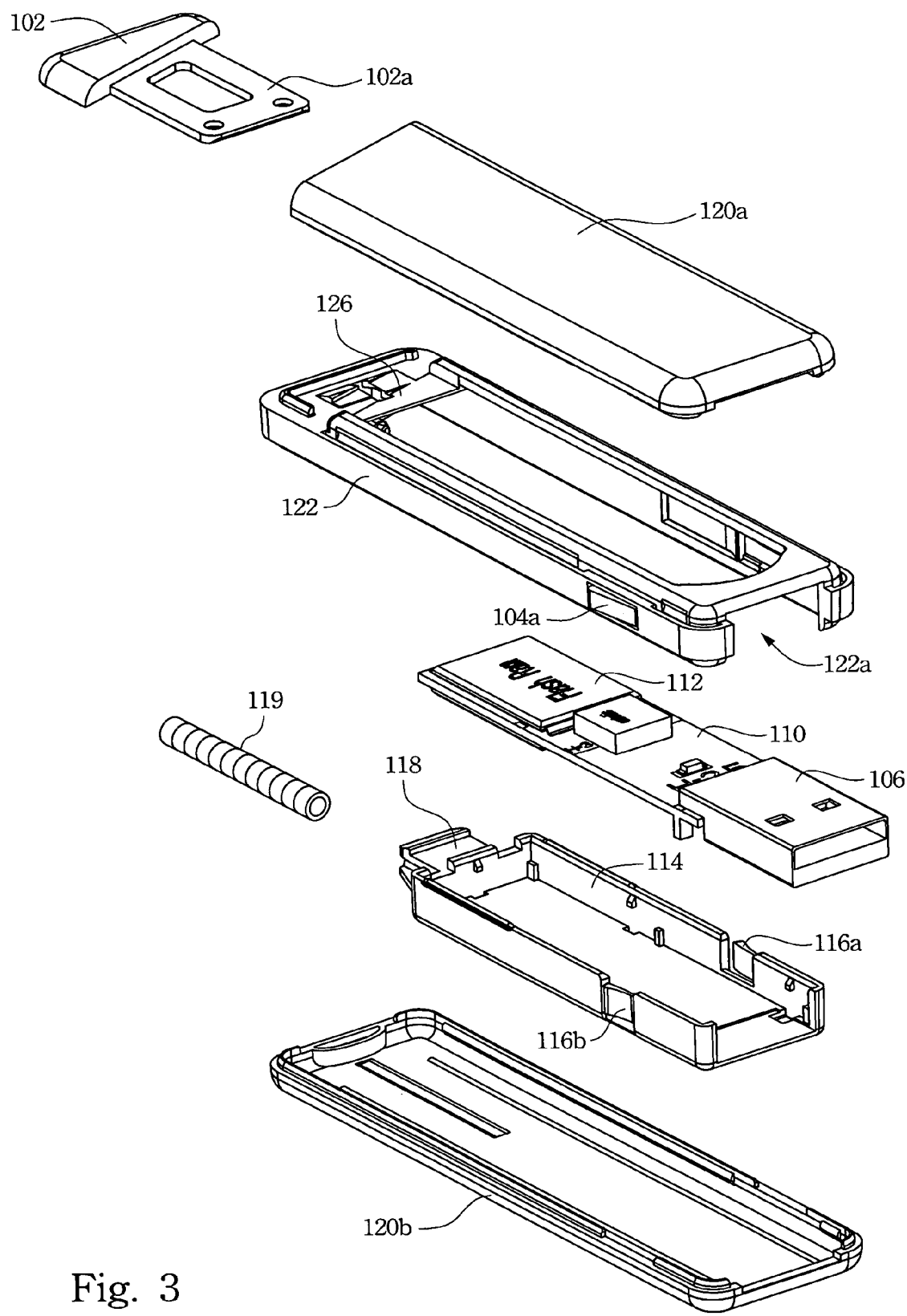
FIG. 3 illustrates an exploded view of a flash memory disk according to one preferred embodiment of this invention.

FIG. 3 illustrates an exploded view of a flash memory disk according to one preferred embodiment of this invention. A printed circuit board 110 performs the data storage function. The printed circuit board 110 includes a flash memory chip 112 for storing data and the USB connector 106 for communicating with the computer. The printed circuit board 110 is secured within a carrier 114, and the USB connector 106 is exposed. The carrier 114 includes a pair of resilient wing latches 116a and 116b and a resilient end latch 118. A spring 119 and the carrier 114 are assembled into a frame 122. The carrier 114 can slide within the frame 122 so as to extend or retract the USB connector 106 through an opening 122a. The frame 122 includes a resilient support 126 and a pair of switches 104a and 104b. The frame 122 can be made of ABS (Acrylonitrile butadiene styrene) plastic materials in order to provide resilient recovery force for the resilient support 126 and the pair of switches 104a and 104b. After the printed circuit board 110 and the carrier 114 are assembled into the frame 122 an upper housing 120a and a lower housing 120b are assembled to the frame 122. The upper housing 120a further includes a button 102 with a button extension 102a for assembly. The button 102 contacts the resilient support when the upper housing 120a is assembled upon the frame 122.

Figure 4:
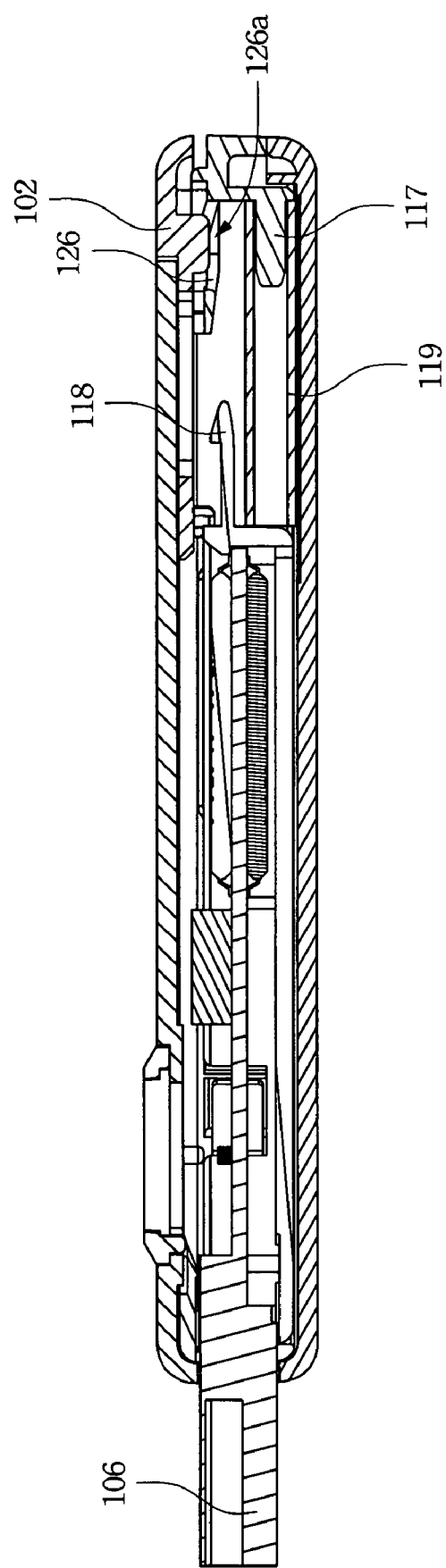
FIG. 4 illustrates a cross-sectional view of a flash memory disk, which is taken along line C-C' of FIG. 1A.

FIG. 4 illustrates a cross-sectional view of a flash memory disk, which is taken along line C-C' of FIG. 1A. The USB connector 106 is extended from the housing of the flash memory disk for readily inserting into a corresponding receptacle of a computer. The resilient end latch 118 is removed from a recess 126a of the resilient support 126. The spring 119 provides a force to extend the USB connector 106 from the housing. A cylinder-shaped holder 117 restricts the spring 119.

Figure 5:
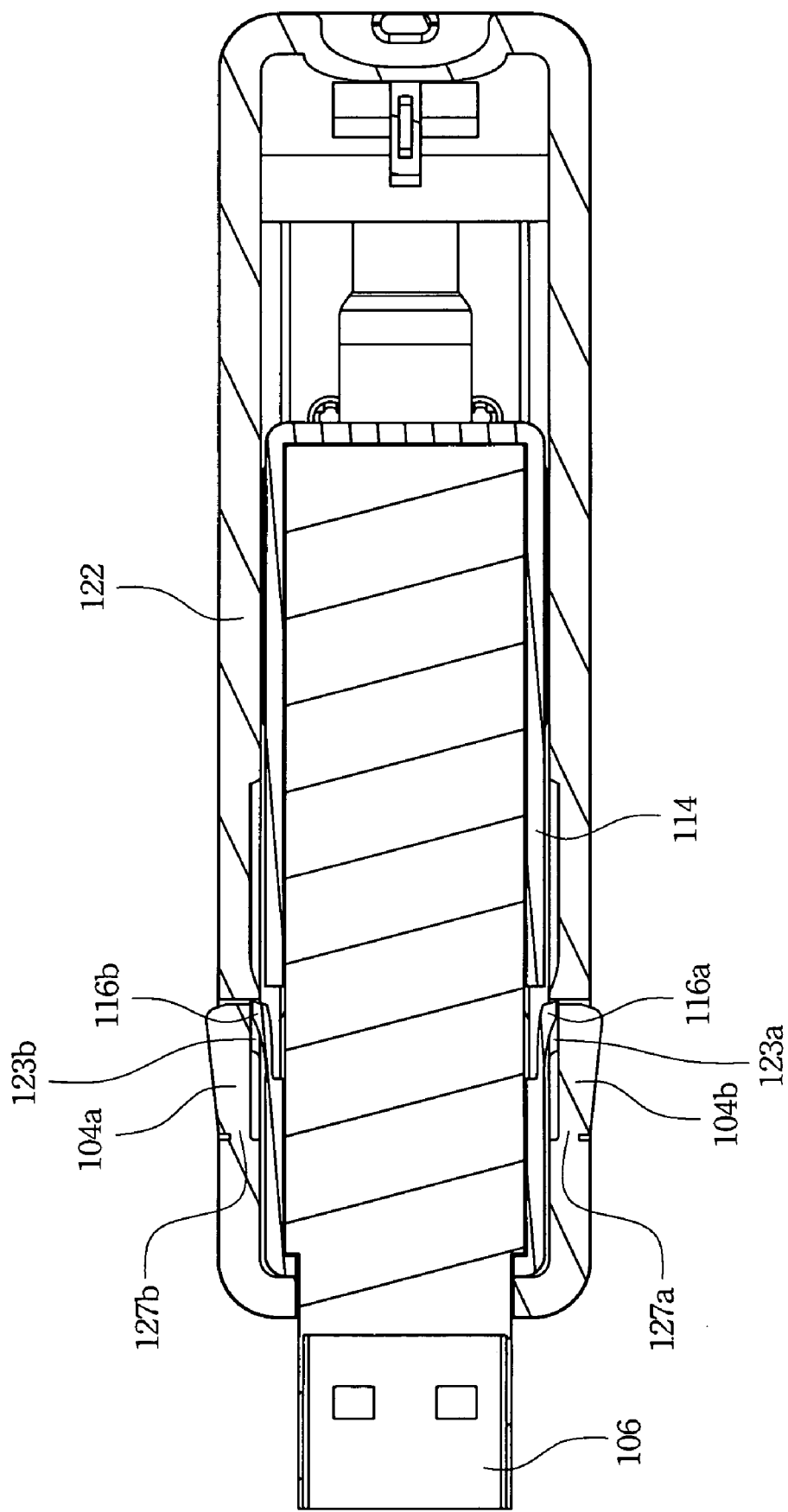
FIG. 5 illustrates a cross-sectional-view of a flash memory disk, which is taken along line D-D' of FIG. 1B.

FIG. 5 illustrates a cross-sectional view of a flash memory disk, which is taken along line D-D' of FIG. 1B. The USB connector 106 is extended from the housing of flash memory disk for readily inserting into a corresponding receptacle of a computer. The pair of switches 104a and 104b extend from the frame 122 and are constricted at the connection portions 127a and 127b, where they are connected with the frame 122. Two cut-outs respectively on the connection portions 127a and 127b are used to narrow thereof. A pair of recesses 123a and 123b are formed at inner surfaces of the pair of switches 104a and 104b. When the USB connector 106 is extended from the frame 122, each of the pair of resilient wing latches 116a and 116b moves outwards to engage into each of the pair of recesses 123a and 123b at inner surfaces of the pair of switches 127a and 127b in order to prevent the USB connector 106 from being retracted. In contrast, the USB connector 106 becomes retractable when the pair of switches 104a and 104b are pressed and the pair of resilient wing latches 116a and 116b are flexed inwards and removed from the pair of recesses 123a and 123b.

Figure 6:
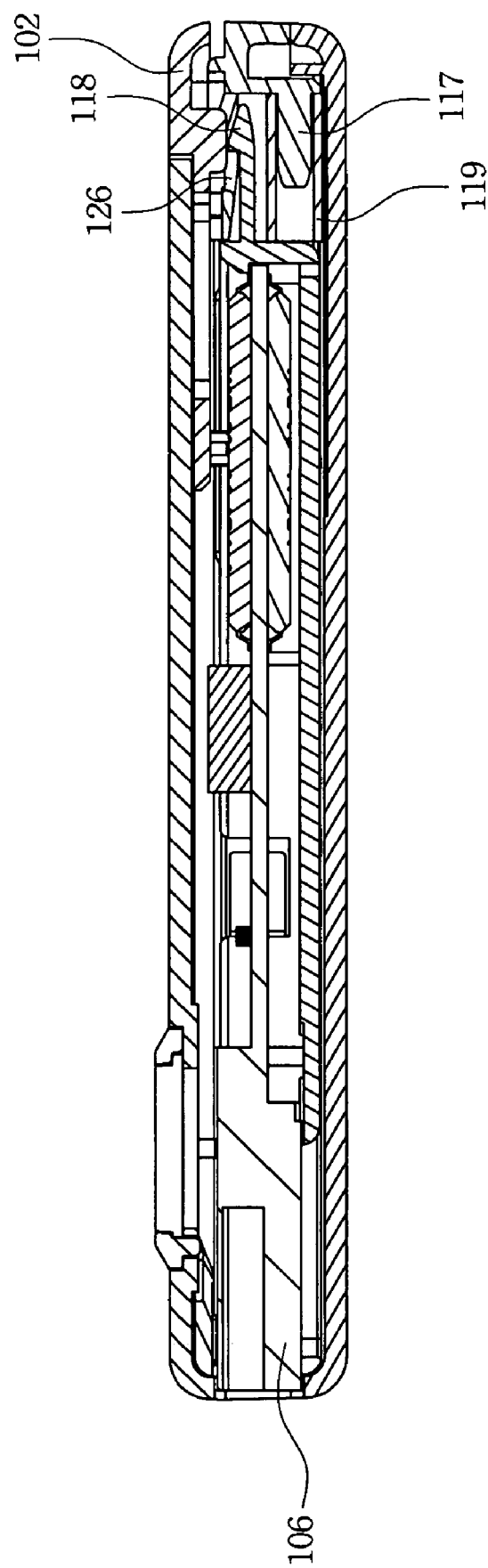
FIG. 6 illustrates a cross-sectional view of a flash memory disk, which is taken along line E-E' of FIG. 2.

FIG. 6 illustrates a cross-sectional view of a flash memory disk, which is taken along line E-E' of FIG. 2. When the USB connector 106 becomes retractable and is pressed back into the housing, the resilient end latch 118 engages into a recess 126a of the resilient support 126 and becomes immovable until the button is pressed.

According to preferred embodiments of the present invention, the flash memory disk not only provides a function of storing its USB connector, but also extends its USB connector by merely pushing a button.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory disk, comprising:
a frame, having an opening, a resilient support and a pair of switches, the pair of switches being extended from the frame and being constricted at the connection portion of each switch and the frame, a pair of recesses being formed at inner surfaces of the pair of switches;
a printed circuit board, including a flash memory and a USB connector thereon;
a carrier, having a pair of resilient wing latches and a resilient end latch, the carrier accommodating the printed circuit board and exposing the USB connector, the carrier sliding within the frame so as to extend or retract the USB connector through the opening,
when the USB connector extends from the frame, each of the pair of resilient wing latches moves outwards to engage into each of the pair of recesses at inner surfaces of the pair of switches,
when the USB connector is retracted within the frame, the resilient end latch engages into a recess of the resilient support;
a spring, secured between the carrier and the frame so as to provide a force for extending the USB connector;
an upper housing, being assembled upon the frame, the upper housing including a button contacting the resilient support, wherein when the button is pressed, the resilient end latch is removed from the recess of the resilient support; and
a lower housing, being assembled to the frame.

2. The flash memory disk of claim 1, wherein the frame is made of ABS (acrylonitrile butadiene styrene) plastic materials.

3. The flash memory disk of claim 1, wherein the USB connector is retracted by a user until the resilient end latch engages into a recess of the resilient support when the pair of resilient wing latches is removed from the pair of recesses at inner surfaces of the pair of switches.

* * * * *